United States Patent
Merrill et al.

(10) Patent No.: US 9,353,304 B2
(45) Date of Patent: May 31, 2016

(54) THERMAL INTERFACE MATERIAL AND METHOD OF MAKING AND USING THE SAME

(75) Inventors: Natalie Merrill, Liberty Lake, WA (US); Andrew Delano, Spokane Valley, WA (US); David Steele, Spokane, WA (US)

(73) Assignee: Honeywell International Inc., Morris Plains, NJ (US)

( * ) Notice: Subject to any disclaimer, the term of this patent is extended or adjusted under 35 U.S.C. 154(b) by 957 days.

(21) Appl. No.: 13/254,683

(22) PCT Filed: Dec. 22, 2009

(86) PCT No.: PCT/US2009/069090
§ 371 (c)(1),
(2), (4) Date: Sep. 2, 2011

(87) PCT Pub. No.: WO2010/104542
PCT Pub. Date: Sep. 16, 2010

(65) Prior Publication Data
US 2011/0308782 A1     Dec. 22, 2011

Related U.S. Application Data

(60) Provisional application No. 61/156,733, filed on Mar. 2, 2009.

(51) Int. Cl.
*C09K 5/08* (2006.01)
*H01L 23/373* (2006.01)

(52) U.S. Cl.
CPC .............. *C09K 5/08* (2013.01); *H01L 23/3737* (2013.01); *H01L 2924/00* (2013.01); *H01L 2924/0002* (2013.01); *H01L 2924/3011* (2013.01)

(58) Field of Classification Search
CPC ................. C09K 5/08; H01L 23/3737; H01L 2924/3011; H01L 2924/0002; H01L 2924/00
USPC .......................................... 165/185; 524/115
See application file for complete search history.

(56) References Cited

U.S. PATENT DOCUMENTS

| | | | | |
|---|---|---|---|---|
| 3,262,997 | A | * | 7/1966 | Edwards et al. ............... 525/194 |
| 4,816,086 | A | * | 3/1989 | Oleske ........................... 148/247 |
| 4,910,050 | A | * | 3/1990 | Oldham et al. ............... 427/386 |
| 5,391,924 | A | | 2/1995 | Uchida et al. |
| 5,660,917 | A | | 8/1997 | Fujimori et al. |
| 6,090,484 | A | | 7/2000 | Bergerson et al. |
| 6,238,596 | B1 | * | 5/2001 | Nguyen et al. ................. 252/502 |
| 6,451,422 | B1 | | 9/2002 | Nguyen et al. |
| 6,645,643 | B2 | | 11/2003 | Zafarana et al. |
| 6,815,486 | B2 | | 11/2004 | Bhagwagar et al. |
| 6,874,573 | B2 | | 4/2005 | Collins et al. |

(Continued)

FOREIGN PATENT DOCUMENTS

WO  WO87/06492  *  4/1987
WO  WO 2008-121491  10/2008

OTHER PUBLICATIONS

International Search Report and Written Opinion PCT/US2009/069090; Dec. 22, 2009; 8 pages.

*Primary Examiner* — Angela C Scott
(74) *Attorney, Agent, or Firm* — Faegre Baker Daniels LLP

(57) ABSTRACT

A thermal interface material comprises a polymeric elastomer material, a thermally conductive filler, and a coupling agent, along with other optional components. In one exemplary heat transfer material, a coupling agent having the formula:

Formula I:

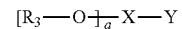

where Y is either a cyclic structure or Y is represented by Formula II:

Formula II:

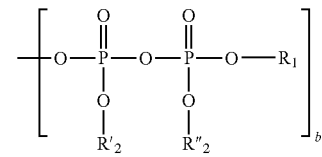

where:
a=1 or 2
b=2 or 3
$R_1$ contains at least one of a neoalkoxy group, an ether group, or a C2-C30 straight or branched alkyl, alkenyl, alkynyl, aralkyl, aryl, or alkaryl group
$R'_2$ and $R''_2$ are independently selected from Hydrogen, a neoalkoxy group, an ether group, and a C2-C30 straight or branched alkyl, alkenyl, alkynyl, aralkyl, aryl, or alkaryl group
X=Group four transition metal; and
where a=1, $R_3$ contains at least one of a neoalkoxy group, an ether group, or a C2-C30 straight or branched alkyl, alkenyl, alkynyl, aralkyl, aryl, or alkaryl group; or
where a=2, the two $R_3$ groups independently contain at least one of a neoalkoxy group, an ether group, or a C2-C30 straight or branched alkyl, alkenyl, alkynyl, aralkyl, aryl, or alkaryl groups or the two $R_3$ groups together form an alkyldiolato group
and, if Y is a cyclic structure, X is a member of the cyclic structure and the cyclic structure also contains a pyrophosphate group such as Formula II shown above.

24 Claims, 1 Drawing Sheet

(56) References Cited

U.S. PATENT DOCUMENTS

| | | |
|---|---|---|
| 6,908,669 B2 | 6/2005 | Nguyen et al. |
| 6,924,027 B2 | 8/2005 | Matayabas et al. |
| 6,956,739 B2 | 10/2005 | Bunyan et al. |
| 7,147,367 B2 | 12/2006 | Balian et al. |
| 7,244,491 B2 | 7/2007 | Nguyen et al. |
| 7,417,078 B2 | 8/2008 | Fujiki et al. |
| 2003/0178139 A1* | 9/2003 | Clouser et al. ............... 156/330 |
| 2004/0037965 A1* | 2/2004 | Salter .......................... 427/407.1 |
| 2005/0072334 A1 | 4/2005 | Czubarow et al. |
| 2005/0256291 A1 | 11/2005 | Okamoto et al. |
| 2005/0287362 A1* | 12/2005 | Garcia-Ramirez et al. ... 428/343 |
| 2006/0040112 A1 | 2/2006 | Dean et al. |
| 2006/0155029 A1* | 7/2006 | Zucker ......................... 524/394 |
| 2007/0097651 A1* | 5/2007 | Canale et al. ................. 361/704 |
| 2007/0164424 A1* | 7/2007 | Dean et al. .................... 257/707 |
| 2007/0166554 A1 | 7/2007 | Ruchert et al. |
| 2007/0241307 A1* | 10/2007 | Nguyen ........................ 252/71 |
| 2007/0293604 A1* | 12/2007 | Frenkel et al. ................ 524/13 |
| 2008/0021146 A1 | 1/2008 | Komatsu et al. |
| 2008/0023665 A1 | 1/2008 | Weiser et al. |

* cited by examiner

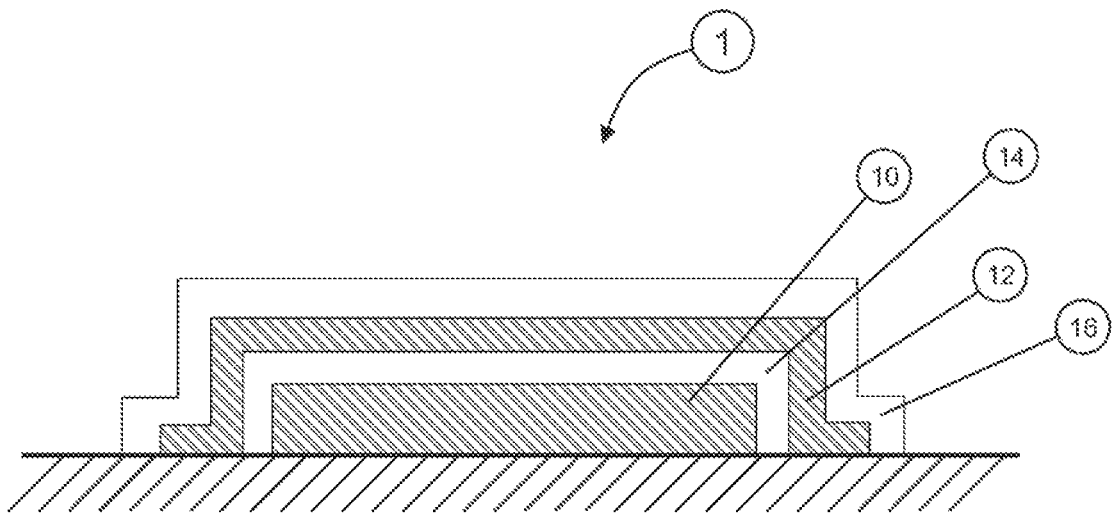

THERMAL INTERFACE MATERIAL AND METHOD OF MAKING AND USING THE SAME

CROSS-REFERENCE TO RELATED APPLICATION

This application is a national phase application of PCT/US2009/069090, filed Dec. 22, 2009, which claims priority to Provisional Application No. 61/156,733, filed Mar. 2, 2009. Both of these applications are hereby incorporated herein by reference in their entirety.

BACKGROUND

Electronic components are used in ever increasing numbers of consumer and commercial products. As consumer demand drives electronic devices to become smaller and operate at higher speeds, heat energy dissipated from electronic components in these devices increases dramatically. A common practice in the industry is to use thermal interface materials (TIMs) such as thermal grease, or grease-like materials, phase change materials or elastomer tapes, alone or on a carrier in such devices to transfer the excess heat dissipated across physical interfaces. However, when the ability of these materials to transfer heat breaks down, the performance of the electronic device in which they are used may be adversely affected.

SUMMARY OF THE INVENTION

According to some embodiments of the present invention, a heat transfer material comprises a polymeric elastomer material, a wax, a thermally conductive filler, an antioxidant, and a coupling agent.

In some embodiments, the coupling agent has the Formula I:

Formula I:

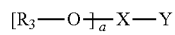

where Y is either a cyclic structure or Y is represented by Formula II:

Formula II:

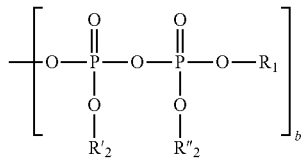

where:
a=1 or 2
b=2 or 3
$R_1$ contains at least one of a neoalkoxy group, an ether group, or a C2-C30 straight or branched alkyl, alkenyl, alkynyl, aralkyl, aryl, or alkaryl group
$R'_2$ and $R''_2$ are independently selected from Hydrogen, a neoalkoxy group, an ether group, and a C2-C30 straight or branched alkyl, alkenyl, alkynyl, aralkyl, aryl, or alkaryl group X=Group four transition metal; and
where a=1, $R_3$ contains at least one of a neoalkoxy group, an ether group, or a C2-C30 straight or branched alkyl, alkenyl, alkynyl, aralkyl, aryl, or alkaryl group; or
where a=2, the two $R_3$ groups independently contain at least one of a neoalkoxy group, an ether group, or a C2-C30 straight or branched alkyl, alkenyl, alkynyl, aralkyl, aryl, or alkaryl groups or the two $R_3$ groups together form an alkyldiolato group
and, if Y is a cyclic structure, X is a member of the cyclic structure and the cyclic structure also contains a pyrophosphate group such as Formula II shown above. For example, $R_1$ in Formula II may be absent and the oxygen atom that is adjacent to $R_1$ is coupled directly or indirectly to X.

Also disclosed are electronic subassemblies and electronic devices in which the heat transfer material is incorporated, along with methods for manufacturing heat transfer materials and methods for using heat transfer materials.

BRIEF DESCRIPTION OF THE DRAWINGS

FIG. 1 shows a cross-sectional view of an electronic assembly according to some embodiments of the present invention.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims.

DETAILED DESCRIPTION

Thermal interface materials are used in a wide variety of electronic devices. For example, electronic devices that include one or more semiconductor dies may use a thermal interface material in order to facilitate the removal of heat from the one or more semiconductor dies.

FIG. 1 shows an electronic assembly 1, which may be subsequently integrated into an electronic device and sold as a part of the electronic device. The assembly 1 includes a semiconductor die or processor 10, a heat spreader 12, and a thermal interface material (TIM1) 14 disposed between the semiconductor die 10 and the heat spreader 12. As shown, the TIM1 14 contacts at least a portion of the surface of both the semiconductor die 10 and the heat spreader 12, providing a physical interface through which thermal energy can be transmitted. As discussed in more detail below, the TIM1 14 can be formulated to maximize the contact area between the TIM1 14 and the semiconductor die 10 and between the TIM1 14 and the heat spreader 12. This contact area facilitates heat transfer from the semiconductor die 10 through the TIM1 14 and the heat spreader 12 to the surrounding environment. The surrounding environment may be air or any other gas within or around an electronic device, or another solid or non-solid material.

FIG. 1 also shows a thermal interface material (TIM2) 16 in contact with the heat spreader 12. The TIM2 16 may be disposed over the heat spreader 12 and may provide for increased heat transfer from the heat spreader 12 to a heat sink (not shown). The TIM2 16 may be formulated to maximize the contact area between the TIM2 16 and the heat spreader 12 and between the TIM2 16 and the heat sink. This contact area facilitates heat transfer from the heat spreader 12 through the TIM2 16 and the heat sink to the surrounding environment. In such an embodiment, the TIM2 16 may contact at least a portion of the surface of both the heat spreader 12 and the heat sink, providing a physical interface through which thermal energy can be transmitted. The heat sink may facilitate the transfer or thermal energy to the surrounding environment and/or facilitate the storage of thermal energy. The surrounding environment may be air or any other gas within or around an electronic device, or another solid or non-solid material in contact with the TIM2 16 (e.g., the heat sink). While FIG. 1 shows both the TIM1 and the TIM2, in some alternative embodiments only a TIM1 may be used and the TIM2 omitted.

In yet other embodiments, a heat sink may be disposed over the die or processor and a thermal interface material may be disposed between the die or processor and heat sink (in such embodiments the heat spreader 12 may be omitted). This configuration is often referred to as a TIM1.5 application. In such an embodiment, the TIM1.5 may contact at least a portion of the surface of both the die or processor and the heat sink, providing a physical interface through which thermal energy can be transmitted. The heat sink may facilitate the transfer or thermal energy to the surrounding environment and/or facilitate the storage of thermal energy.

In some embodiments the TIM1 and TIM2 materials may comprise the same material, while in other embodiments the TIM1 and TIM2 materials comprise different materials. For example, any of the thermal interface materials described herein may be used as a TIM1, a TIM2, both a TIM1 and TIM2, or as a TIM1.5.

The thermal interface material includes a heat transfer material that generally comprises a polymeric elastomer material, a thermally conductive filler, and a coupling agent, along with other optional components. In one embodiment, the thermal interface material may comprise a polymeric elastomer material, a wax, a thermally conductive filler, an antioxidant and a coupling agent.

The coupling agent is an organometallic compound.

In some embodiments, the coupling agent may be represented by Formula I:

Formula I:

$$[R_3\!-\!\!-\!\!O\!]_a\!-\!\!X\!-\!\!Y$$

where Y is either a cyclic structure or Y is represented by Formula II:

Formula II:

$$\left[\!-\!\!O\!-\!\!\underset{\underset{R'_2}{\overset{\overset{O}{\|}}{P}}}{\overset{}{-}}\!\!-\!\!O\!-\!\!\underset{\underset{R''_2}{\overset{\overset{O}{\|}}{P}}}{\overset{}{-}}\!\!-\!\!O\!-\!\!R_1\!\right]_b$$

where:
a=1 or 2
b=2 or 3

$R_1$ contains at least one of a neoalkoxy group, an ether group, or a C2-C30 straight or branched alkyl, alkenyl, alkynyl, aralkyl, aryl, or alkaryl group $R'_2$ and $R''_2$ are independently selected from Hydrogen, a neoalkoxy group, an ether group, and a C2-C30 straight or branched alkyl, alkenyl, alkynyl, aralkyl, aryl, or alkaryl group X=Group four transition metal; and
where a=1, $R_3$ contains at least one of a neoalkoxy group, an ether group, or a C2-C30 straight or branched alkyl, alkenyl, alkynyl, aralkyl, aryl, or alkaryl group; or where a=2, the two $R_3$ groups independently contain at least one of a neoalkoxy group, an ether group, or a C2-C30 straight or branched alkyl, alkenyl, alkynyl, aralkyl, aryl, or alkaryl groups or the two $R_3$ groups together form an alkyldiolato group and, where Y is a cyclic structure, X may be a member of the cyclic structure and the cyclic structure may also contain a heteroatom group, for example a pyrophosphate group such as Formula II shown above, or any of the other heteroatoms described herein. For example, in some embodiments $R_1$ in Formula II may be absent and the oxygen atom that is adjacent to $R_1$ is coupled directly or indirectly to X. As one example of such a cyclic structure that contains a pyrophosphate heteroatom group, see Formula IX below.

For example, in some embodiments, the coupling agent may be represented by the Formula III:

Formula III:

$$\left[R_6\!-\!\!-\!\!O\!\right]_c\!-\!\!X\!\left[\!-\!\!O\!-\!\!\underset{\underset{OH}{\overset{\overset{O}{\|}}{P}}}{\overset{}{-}}\!\!-\!\!O\!-\!\!\underset{\underset{R_5}{\overset{\overset{O}{\|}}{P}}}{\overset{}{-}}\!\!-\!\!O\!-\!\!R_4\right]_d$$

where:
c=1 or 2
d=2 or 3

$R_4$ contains at least one of a neoalkoxy group, an ether group, or a C2-C30 straight or branched alkyl, alkenyl, alkynyl, aralkyl, aryl, or alkaryl group $R_5$ contains at least one of a neoalkoxy group, an ether group, or a C2-C30 straight or branched alkyl, alkenyl, alkynyl, aralkyl, aryl, or alkaryl group X=Group four transition metal; and
where c=1, $R_6$ contains at least one of a neoalkoxy group, an ether group, or a C2-C30 straight or branched alkyl, alkenyl, alkynyl, aralkyl, aryl, or alkaryl group; or where c=2, the two $R_6$ groups independently contain at least one of a neoalkoxy group, an ether group, or a C2-C30 straight or branched alkyl, alkenyl, alkynyl, aralkyl, aryl, or alkaryl groups or the two $R_6$ groups together form an alkyldiolato group.

In some embodiments, the coupling agent includes one or more titanium atoms, zirconium atoms, or other suitable Group four transition metal. In some such embodiments, the metal has at least one heteroatom functional group attached to the metal atom, for example a pyrophosphate functional group. Examples of suitable pyrophosphate groups are described in U.S. Pat. No. 4,634,785, filed Sep. 14, 1984, entitled "Titanium and Zirconium Pyrophosphates, their Preparation and Use"; and U.S. Pat. No. 4,122,062, filed Sep. 30, 1975, entitled "Alkoxy Titanate Salts Useful as Coupling Agents", both of which are herein incorporated by reference in their entirety. In some embodiments, the coupling agent has one, two or three such heteroatom functional groups attached to the metal atom. Each of the heteroatom functional groups may comprise one or more or two or more heteroatoms (e.g., one, two, or two or more, phosphate atoms), and the one or more heteroatoms may each have a number of oxygen atoms bonded thereto (in some cases, an oxygen atom may also be disposed between, and bonded directly to, two of the heteroatoms). Further, in some embodiments at least one of the heteroatoms may have one or more hydroxyl groups bonded thereto. One exemplary heteroatom functional group comprises a pyrophosphate functional group with at least one hydroxyl group attached to one of the phosphate atoms.

In addition, each of the one or more heteroatom functional groups may have one or more organic groups attached to the heteroatom functional group (e.g., see the —OR$_1$, —OR'$_2$, —OR"$_2$, —OR$_4$, and OR$_5$ groups in the above formulas). As described above, the R$_1$, R'$_2$, R"$_2$, R$_4$, and R$_5$ groups may contain neoalkoxy groups, ether groups, and/or straight or branched alkyl, alkenyl, alkynyl, aralkyl, aryl, or alkaryl group groups. The R$_1$, R'$_2$, R"$_2$, R$_4$, and R$_5$ groups may have from 2 to 30 carbon atoms, from 6 to 24 carbon atoms, from 8 to 24 carbon atoms, or from 8 to 16 carbon atoms. In some embodiments in which two or more organic groups are attached to a heteroatom functional group, the organic groups on a given heteroatom are the same, while in other embodiments the organic groups may differ from one another. As one example, one or more of the organic groups may be an alkyl group attached to the oxygen, together representing an alkylether group such as an octylether group (e.g., see Formulas IV through IX, shown below), and each heteroatom functional group may have two octylether groups attached thereto.

The metallic atom of the organometallic compound may also have one or two organic groups attached directly thereto (for example, see the R$_3$O— or R$_6$O— groups in Formulas I and III). For example, the one or more organic groups attached to the metallic atom may contain a neoalkoxy group, an ether group, and/or the R$_3$ or R$_6$ group may contain a C2-C30, C6-C24, C8-C24, or C8-C16 straight or branched alkyl, alkenyl, alkynyl, aralkyl, aryl, alkaryl group.

A neoalkoxy group is a branched organic functional group that in some embodiments may have the formula (R$_7$)(R$_8$)(R$_9$)CCH$_2$O—, where the R$_7$, R$_8$ and R$_9$ are each a monovalent alkyl, alkenyl, alkynyl, aralkyl, aryl, or alkaryl group, a halogen, an ether substituted derivative thereof, an oxy derivative or an ether substituted oxy derivative of any of these groups. Specific examples of such organic functional groups that may be attached directly to the metallic atom or a heteroatom group include 2,2 (bis 2-propenolatomethyl)butanolato and 2-propanolato. Additional examples of neoalkoxy functional groups are provided in U.S. Pat. No. 4,600,789, filed May 14, 1984, entitled "Neoalkoxy Organo-Titanate Useful as Coupling and Polymer Processing Agents"; U.S. Pat. No. 4,623,738, filed Apr. 22, 1985, entitled "Neoalkoxy Organo-Titanates and Organo-Zirconates Useful as Coupling and Polymer Processing Agents"; and U.S. Pat. No. 4,657,988, filed Feb. 28, 1986, entitled "Repolymerization." All of these patents are herein expressly incorporated by reference in their entirety.

As mentioned above, in some embodiments in which a=2 or c=2, the two R$_3$O— or R$_6$O— groups may be joined together, in some embodiments forming a diolato structure, for example an alkyldiolato group (e.g., see the structures shown below in chemical formulas (IV) and (VIII)). The alkyldiolato may be an oxoalkyldiolato or a dioxoalkyldiolato. The alkydiolato groups may also comprise side chains comprising additional organic functional groups. Examples of diolato groups that may be included as the R$_3$O— or R$_6$O— groups are provided in U.S. Pat. No. 4,087,402, filed Apr. 19, 1976, entitled "Organo-Titanate Chelates and Their Uses"; and U.S. Pat. No. 4,277,415, filed Aug. 29, 1979, entitled "Pyrophosphato Titanate Adducts," both of which are incorporated by reference herein in their entirety.

Following are some examples of coupling agents that may be used in the present invention:

Zirconium IV 2,2 (bis 2-propenolatomethyl)butanolato, tris(diisooctyl)pyrophosphato-O:

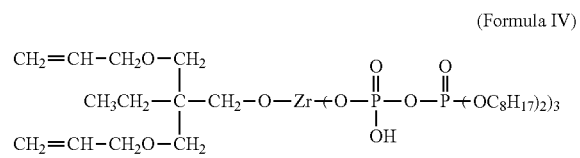

(Formula IV)

Titanium IV bis(dioctyl)pyrophosphato-O, ethylenediolato (adduct), bis(dioctyl)hydrogen phosphite:

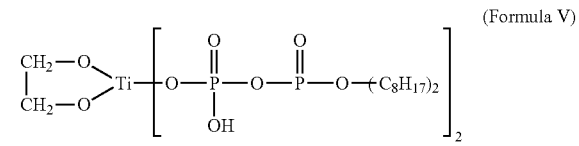

(Formula V)

Titanium IV, 2-propanolato, tris(dioctyl)-pyrophosphato-O) adduct with 1 mole of diisooctyl phosphite:

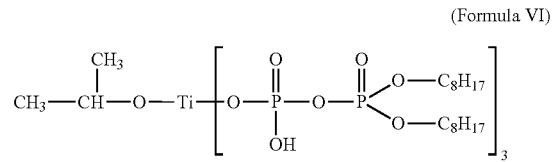

(Formula VI)

Titanium IV 2,2 (bis 2-propenolatomethyl)butanolato, tris(dioctyl)pyrophosphato-O:

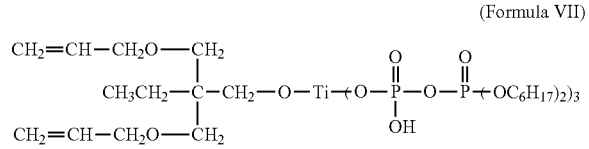

(Formula VII)

Titanium IV bis(dioctyl)pyrophosphato-O, oxoethylenediolato, (adduct), bis(dioctyl) (hydrogen)phosphite:

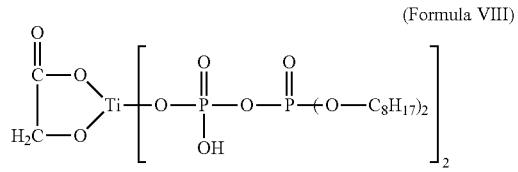

(Formula VIII)

(Zirconium IV 2,2-bis(2-propenolatomethyl)butanolato, cyclo di[2,2-(bis 2-propenolatomethyl)butanolato], pyrophosphato-O,O):

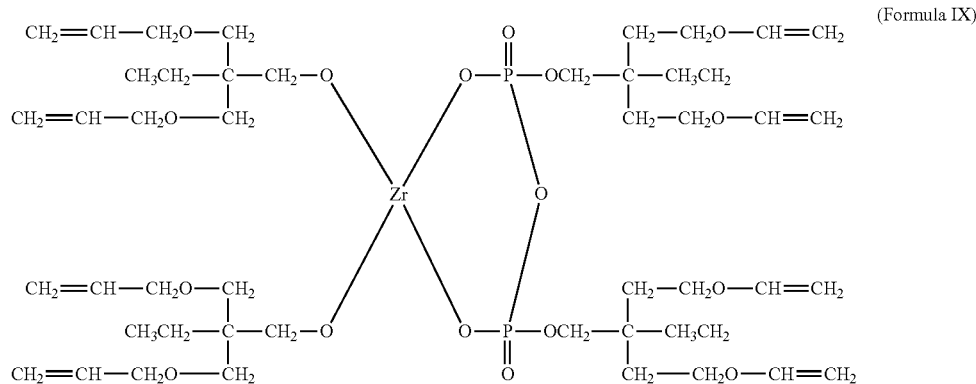

(Formula IX)

The heat transfer material may include any one of the coupling agents generally or specifically described above, or any combination thereof. The heat transfer material may comprise from about 0.1 wt % to about 3 wt %, from about 0.30 wt % to about 2.0 wt %, or from about 0.50 wt % to about 1.0 wt %, of coupling agent.

In some embodiments, the polymeric elastomeric component is a silicone rubber, a siloxane rubber, a siloxane copolymer or any other suitable silicone-containing rubber. In other embodiments, the polymeric elastomeric component is a hydrocarbon rubber compound or a blend of rubber compounds. The hydrocarbon rubbers may comprise saturated or unsaturated rubber compounds. In some embodiments, saturated rubbers may be used and may be less sensitive to thermal oxidation degradation. Examples of saturated rubbers that may be used in accordance with the invention are ethylene-propylene rubbers (EPR, EPDM), polyethylene/butylene, polyethylene-butylene-styrene, polyethylene-propylene-styrene, hydrogenated polyalkyldiene "mono-ols" (such as hydrogenated polybutadiene mono-ol, hydrogenated polypropadiene mono-ol, hydrogenated polypentadiene mono-ol), hydrogenated polyalkyldiene "diols" (such as hydrogenated polybutadiene diol, hydrogenated polypropadiene diol, hydrogenated polypentadiene diol) and hydrogenated polyisoprene, polyolefin elastomer, or any other suitable saturated rubber, or blends thereof. In some embodiments, a hydrogenated polybutadiene mono-ol may be used, and in some cases is referred to as a hydroxyl-terminated ethylene butylene copolymer, specialty mono-ol.

In other embodiments, unsaturated rubbers may be used. Examples of unsaturated rubbers and rubber compounds are polybutadiene, polyisoprene, polystyrene-butadiene and other suitable unsaturated rubbers, blends thereof, or blends of saturated and unsaturated rubber compounds. If the rubber is unsaturated, in some embodiments the compound may undergo a hydrogenation process to rupture or remove at least some of the double bonds. As used herein, the phrase "hydrogenation process" means that an unsaturated organic compound is reacted with hydrogen by either a direct addition of hydrogen to some or all of the double bonds, resulting in a saturated product (addition hydrogenation), or by rupturing the double bond entirely, whereby the fragments further react with hydrogen (hydrogenolysis).

The rubber compounds may be "self-crosslinkable" in that they could crosslink intermolecularly with other rubber molecules or intramolecularly with themselves, depending on the other components of the composition. The intramolecular and intermolecular cross-linking with the rubber compounds may be facilitated by optional cross-linking agents, as discussed further below.

The heat transfer material may comprise from about 1 wt % to about 50 wt %, or from about 3 wt % to about 14 wt %, or from about 5 wt % to about 10 wt %, of polymeric elastomer material.

The thermally conductive filler materials may comprise thermal filler particles that are dispersed in the heat transfer material. The thermal filler particles generally have a high thermal conductivity. Suitable filler materials include silver, aluminum, copper and alloys thereof, boron nitride, aluminum nitride, silver coated copper, silver coated aluminum, carbon fiber, and metal coated carbon fiber such as nickel coated fiber. Typical filler average particle sizes may be in the range between about 0.5 and about 25 µm, between about 1 µm and about 25 µm, or between about 2 µm and about 20 µm, with a maximum particle size of about 100 µm. The particle size distribution of the filler particles may be a unimodal distribution or a mutilmodal (e.g., bimodal or trimodal) distribution. Dispersion of filler particles within the polymeric elastomer material may be facilitated by addition of the coupling agents described above. The heat transfer material may comprise between about 30 wt % and about 99 wt %, from about 80 wt % to about 95 wt %, or from about 85 wt % to about 92 wt %, of thermal filler material.

In addition, the heat transfer material may also have an optional wax or phase change material. For some applications such as land grid array (LGA) applications, the waxes or phase change materials may have a melting point of less than about 90° C., between about 40° C. and about 90° C., between about 45° C. and about 70° C., or between about 45° C. and about 60° C. For other applications such as ball grid array (BGA), high temperature LGA, or non-LGA applications, the waxes or phase change materials may have a melting point of less than about 165° C., less than about 110° C., between about 40° C. and about 165° C., between about 45° C. and about 110° C., or between about 45° C. and about 60° C.

The heat transfer material may comprise less than about 30 wt %, less than about 10 wt %, or from about 1 wt % to about 5 wt %, of wax or other phase change material. The wax or phase change component of the heat transfer material may comprise paraffin waxes (i.e., microcrystalline paraffin waxes), polymer waxes or natural waxes, or any combination thereof. Paraffin waxes are a mixture of solid hydrocarbons having a general formula $C_nH_{2n+2}$, having melting points in the range of about 20° C. to about 100° C. Typically polymer waxes are polyethylene waxes, polypropylene waxes, or copolymers (e.g., ethylene-maleic anhydride or ethylene-vinyl acetate, or other copolymers), and have a range of melting points from about 40° C. to about 165° C., or about 140° C. or less. Natural waxes include carnauba wax (melting point between about 82° C. and about 86° C.) and bees wax (melting point between about 62° C. and about 64° C.).

The wax or phase change component may allow the heat transfer material to have a melting point or a melting point range that is at or below the operating temperature of the electronic device in which the heat transfer material will be used. As such, the heat transfer material may soften or melt under normal operating conditions, allowing the heat transfer material to flow across, and better conform to, any surfaces through which heat transfer is desired. This softening and/or flowing across the heat transfer surfaces may facilitate the efficient transfer of heat between the components of an electronic device. In some embodiments, the heat transfer material may start melting at about 40° C., about 45° C., about 90° C., or about 100° C., or may partially or entirely melt between about 40° C. to about 90° C., between about 45° C. and about 85° C., between about 45° C. and about 50° C., or between about 100° C. and about 115° C.

The wax or phase change material is an optional component. In some embodiments the polymeric elastomer material and/or the filler material and/or an additional component of the heat transfer material may have a phase change within the normal operating temperatures of the electronic device in which the heat transfer material is used. As a result, the polymeric elastomer and/or the filler and/or the additional component of the heat transfer material may facilitate the softening of the heat transfer material during normal operating conditions in order to allow for the heat transfer material to flow across, and better conform to, any surfaces through which heat transfer is desired.

Optional additional components may comprise an oil, such as an α-olefin copolymer, an ethylene-propylene copolymer, a paraffinic oil or other non-crystalline aliphatic material. As one example, an oil may be used, which may also be described as a hydrocarbon-based synthetic oil having no polar groups, or a co-oligomer of ethylene and alpha-olefin or an ethylene-propylene copolymer oil. Suitable oils include Lucant®, Parapol®, white mineral oil and other vegetable or mineral oils.

Other optional components include a low melting alloy such as Wood's metal, Field's metal or other alloy which melts between about 35° C. and about 180° C., between about 45° C. and about 100° C., or between about 45° C. and about 60° C. One example of Field's metal is a fusible alloy that becomes liquid at approximately 62° C. (144° F.) and is a eutectic alloy of bismuth, indium, and tin, with the following percentages by weight: 32.5% Bi, 51% In, 16.5% Sn. A heat transfer material comprising a low melting alloy may soften during normal operating conditions in order to allow for the heat transfer material to flow across, and better conform to, any surfaces through which heat transfer is desired.

In addition, antioxidants are optionally included in the heat transfer material to inhibit oxidation and thermal degradation of the phase change system. The antioxidant may be phenol type or amine type antioxidants, or any other suitable type of antioxidant, or a combination thereof. The phenol or amine type antioxidant may also be a sterically hindered phenol or amine type antioxidant. For example, the antioxidant may be a phenol type antioxidant such as Irganox® 1076, or octadecyl 3-(3,5-di-(tert)-butyl-4-hydroxyphenyl) propionate. In other embodiments, the antioxidant may be an amine type antioxidant such as Irganox® 565, or 2,6-di-tert-butyl-4-(4, 6-bis(octylthio)-1,3,5-triazin-2-ylamino) phenol. The antioxidant may also be a sulfur containing phenolic antioxidant, for example a sterically hindered sulfur containing phenolic antioxidant. In some embodiments, thermally stable antioxidants from any of the above types of antioxidants may be used. The heat transfer material may comprise from about 0.01 wt % to about 5 wt %, from about 0.05 wt % to about 2 wt %, or from about 0.07 wt % to about 1.1 wt % of antioxidant.

Other optional components may also be added to the heat transfer material. For example, crosslinking compounds or resins may be added to the heat transfer material in order to give the heat transfer material a desired consistency. In some embodiments, amines or amine-based resins are added or incorporated into the rubber composition or mixture of rubber compounds, facilitating a crosslinking reaction between the amines or amine resins and primary or terminal hydroxyl groups on at least one of the rubber compounds. The crosslinking reaction between the amine resin and the rubber compounds produces a "soft gel" phase in the mixture instead of a liquid state. The degree of crosslinking between the amine resin and the rubber composition and/or between the rubber compounds themselves will determine the consistency of the soft gel. For example, if the amine resin and the rubber compounds undergo a minimal amount of crosslinking (10% of the sites available for crosslinking are actually used in the crosslinking reaction) then the soft gel will be more "liquid-like". However, if the amine resin and the rubber compounds undergo a significant amount of crosslinking (40-60% of the sites available for crosslinking are actually used in the crosslinking reaction and possibly there is a measurable degree of intermolecular or intramolecular crosslinking between the rubber compounds themselves) then the gel would become thicker and more "solid-like".

Amine resins are those resins that comprise at least one amine substituent group on any part of the resin backbone. Amine resins are also synthetic resins derived from the reaction of urea, thiourea, melamine or allied compounds with aldehydes, particularly formaldehyde. Typical and contemplated amine resins are primary amine resins, secondary amine resins, tertiary amine resins, glycidyl amine epoxy resins, alkoxybenzyl amine resins, epoxy amine resins, melamine resins, alkylated melamine resins, and melamine-acrylic resins. Melamine resins are particularly useful and preferred in several contemplated embodiments described herein because a) they are ring-based compounds, whereby the ring contains three carbon and three nitrogen atoms, b) they can combine easily with other compounds and molecules through condensation reactions, c) they can react with other molecules and compounds to facilitate chain growth and crosslinking, d) they are more water resistant and heat resistant than urea resins, e) they can be used as water-soluble syrups or as insoluble powders dispersible in water, and f) they have high melting points (greater than about 325° C. and are relatively non-flammable). Alkylated melamine resins, such as butylated melamine resins, are formed by incorporating alkyl alcohols during the resin formation. Other examples of cross-linking compounds and methods are provided in U.S. Pat. No. 7,244,491, entitled "Thermal Interface Materials," which is incorporated herein by reference in its entirety. The heat transfer material may comprise less than about 5 wt %, less than about 2 wt %, or less than about 1 wt %, of crosslinking agent.

The wt % of the different components of the heat transfer material may be any combination of the wt % ranges provided above. As one example, the heat transfer material has from about 5 wt % to about 10 wt % of the polymeric elastomer material, from about 1 wt % to about 5 wt % of the wax or phase change material, from about 85 wt % to about 92 wt % thermally conductive filler, from about 0.07 wt % to about 1.1 wt % antioxidant, and from about 0.65 wt % to about 1.2 wt % coupling agent. Optionally, less than about 1 wt % of a cross-linking agent may also be added to the heat transfer material. Other compounds in addition to those listed above may be added to the heat transfer material, for example any of the compounds provided in U.S. Pat. No. 6,451,422, entitled "Thermal Interface Materials," U.S. Pat. No. 7,244,491, entitled "Thermal Interface Materials", and U.S. Patent Publication No. 2006/0040112, entitled "Thermal Interconnect and Interface Systems, Methods of Production and Uses Thereof," all three of which are incorporated herein by reference in their entirety.

The heat transfer materials described herein may be prepared by combining the polymeric elastomer component, the optional wax or other phase change material, and the optional antioxidant. These components are blended and heated until the wax or other phase change material and/or the polymeric elastomer components melt to form a first mixture. The coupling agent is then added to the mixer and blended with the coupling agent to form a second mixture. The thermal filler material is then added to the second mixture, either all in one step or in multiple steps, and blended to form the final heat transfer material. In some embodiments of the present invention, in the finished heat transfer material, the thermal filler forms discrete domains within the polymeric elastomer component, and as such, even with the addition of the coupling agent, the thermal filler is not homogeneously distributed throughout the polymeric elastomer component.

The heat transfer material may be used in the manufacture of subassemblies and/or electronic devices using a variety of techniques. For example, the heat transfer material may by formed into a series of pads wherein the pads are formed between first and second liners. The thickness of the pads may be approximately 10 mil, or between about 5 and about 20 mil. The pads may be cut to a desired size before or after being placed between the liner materials.

The heat transfer material may optionally be chilled prior to application to make it easier to handle and remove from the liners. The surface of a substrate that the heat transfer material will contact may be cleaned (e.g., a semiconductor die and/or a heat spreader), for example with IPA. The substrate is optionally heated, the first liner is removed from the heat transfer material, and the heat transfer material is applied to the substrate. The substrate may then be allowed to cool and the second liner is then removed. In embodiments in which the heat transfer material is to be placed between a heat spreader and a semiconductor die, the heat transfer material is applied to a first substrate (i.e., one of the heat spreader or the semiconductor die) as described above, and then the first substrate is applied to the second substrate (i.e., the other of the heat spreader or the semiconductor die), essentially forming a sandwich with the heat transfer material between the heat spreader and the semiconductor die, as shown in FIG. 1.

In another method according to some embodiments of the present invention, the heat transfer material is formed into a shape that can be dispensed, for example through a hot melt system. The heat transfer material is melted in the hot melt system, and dispensed onto a first substrate (one of the semiconductor die or the heat spreader). As mentioned above, the semiconductor die and the heat spreader are then placed together, essentially forming a sandwich with the heat transfer material disposed between the heat spreader and the semiconductor die, as shown in FIG. 1.

In yet another method according to some embodiments of the present invention, the heat transfer material is dissolved in a solvent, for example an aliphatic hydrocarbon solvent such as cyclohexane, heptane, dodecane, a paraffinic oil, process oil or isoparaffin fluid, or other suitable solvent. The solution is then applied to one or both of the semiconductor die and the heat spreader using a screen printing process. The semiconductor die and the heat spreader are then placed together, essentially forming a sandwich with the heat transfer material disposed between the heat spreader and the semiconductor die, as shown in FIG. 1.

A number of different types of tests are available for testing the efficacy of a heat transfer material. For example, three examples of such tests are a thermal cycling test, a Highly Accelerated Stress Test (HAST), and a bake test. These tests are typically run on samples of heat transfer material that have been disposed between a heat spreader substrate and a semiconductor substrate. In one example of a thermal cycling test, the heat transfer material is cycled between −55° C. and 125° C. 1000 times. This test is commonly referred to as the TC1000 JEDEC B test. Typically, a thermocouple is affixed to the heat transfer material and the temperature of the heat transfer material is cycled continuously between the two temperatures (when one end of the temperature range is reached, the system begins heating or cooling to the other end of the temperature range). In one example of a HAST test, the heat transfer material is placed in 130° C., 85% RH conditions for 96 hours (this is the full HAST test referred to in the following examples). In one example of a bake test, the heat transfer material is placed in an oven at 125° C. or 150° C. for 1000 hours. In these tests, the heat transfer material is placed in a "sandwich" between a semiconductor material and a heat spreader material (e.g., a nickel coated copper material).

In addition, heat transfer materials may also be tested in an abbreviated HAST test. In this test, the heat transfer materials are placed in an open container (e.g., a lid or tray, typically on a heat spreader material such as a nickel-coated copper). Without being incorporated into a sandwich structure discussed above, the material is subjected to the HAST conditions described above.

Upon completion of any of these tests, the heat spreader/ heat transfer material/semiconductor substrate composite is examined for delamination between the heat transfer material and the heat spreader and/or the semiconductor substrate, or other physical defects. If no defects are found, the material passes the test. The thermal performance (e.g., thermal impedance and/or thermal conductivity) of the test sandwich may also be tested before and after any of these tests. In the abbreviated HAST test, the heat transfer material is inspected for visual defects such as cracks or other deformities and the weight change of the material is also tested. If no defects are found, the material passes the test.

The heat transfer properties of the heat transfer materials may also be tested in a variety of ways. For example, a cut bar test may be used to measure thermal conductivity and thermal impedance. One example of a cut bar test is described in the ASTM D 5470-06 test method. When testing according to this method, at least some of the heat transfer materials described herein have a thermal conductivity of at least about 2.5 W/mK, or at least about 2.7 W/mK, at least about 3.0 W/mK, at least about 3.7 W/mK, at least about 4.0 W/mK, or at least about 4.4 W/mK. Thermal impedance is less than about 0.20 mm$^2$·K/W at 50 micron thickness, less than about 0.16 mm$^2$·K/W at 50 micron thickness, less than about 0.12 mm$^2$·K/W at 50 micron thickness, or less than about 0.10 mm$^2$·K/W at 50 micron thickness.

In addition, the thermal impedance and/or the thermal conductivity may be tested before and after the reliability testing described above. The amount of degradation in the thermal conductivity and/or impedance is an indication of relatively lower thermal performance. For example, the thermal impedance and/or conductivity of some of the heat transfer material embodiments described herein show 0%, less than about 5% or less than about 10% decrease in thermal conductivity (or increase in thermal impedance) subsequent to any of the above reliability tests compared to measurements taken prior to the reliability tests.

Further, the change in the weight of the heat transfer material may also be monitored before and after any of the above tests. In some cases, a weight change of less than about 10%, less than about 5%, less than about 2%, or less than about 1% may indicate that the heat transfer material is thermally stable and may be an effective heat transfer material for TIM1 and/or TIM2 applications.

The following examples are illustrative of a number of embodiments of the invention. (Note that all wt % values provided in the examples are based on the finished weight of the TIM.)

Example 1

In example 1, 6.5 wt % Kraton® elastomer (a hydroxyl-terminated ethylene butylene copolymer, specialty mono-ol), 1.9 wt % of a microcrystalline wax with a melting point of about 45° C., and 0.10 wt % Irganox® 1076 were combined and blended in a heated mixer until the combination had melted and had a substantially homogeneous appearance. 0.7 wt % Titanium IV 2,2 (bis 2-propenolatomethyl)butanolato, tris(dioctyl)pyrophosphato-O was added, and the combination was blended, again until the combination had a substantially homogeneous appearance. 90.8 wt % of Aluminum powder was added, and the combination was again blended until it had a substantially homogeneous appearance. The coupling agent did not appear to be completely miscible with the combination of elastomer, wax and antioxidant.

The thermal interface material was then taped between liner films at 90° C. for 15 minutes, and cut to a 10 mm square. The liners were removed and the square sample placed between a nickel-coated copper spreader and a silicon die, creating a "test sandwich." Thermal impedance measurements were made using flash diffusivity of the test sandwich. Netzsch LFA 447 equipment with a Xenon light source was used for these measurements both before and after HAST testing. The test sandwich was subjected to HAST conditions for 96 hours (HAST testing is described in further detail below). This material passed HAST (there was no significant visible degradation of the TIM, and no delamination between the TIM and the nickel-coated copper spreader or between the TIM and the silicon die). In addition, the thermal performance did not significantly degrade (testing for thermal performance is further described below). Specifically, the thermal impedance of the test sandwich was the same after HAST testing compared to before (both values were 0.09° C.·cm²/W).

Example 2

Example 2 was prepared according to the procedure described above with respect to Example 1. The types and amounts of the different components were also the same as in Example 1, except that Zirconium IV 2,2 (bis 2-propenolatomethyl)butanolato, tris(diisooctyl)pyrophosphato-O was used in place of the Titanium IV 2,2 (bis 2-propenolatomethyl)butanolato, tris(dioctyl)pyrophosphato-O, and Honeywell low density polyethylene A-C® 617 wax (a low-density, low molecular weight polyethylene homopolymer having a Mettler Drop Point of 101° C. by ASTM D-3954 and an ASTM D-5 hardness of 7.0 and a density of 0.91 g/cc by ASTM D-1505) was used in place of the wax used in Example 1. The coupling agent did not appear to be completely miscible with the combination of elastomer, wax and antioxidant. This TIM was used to produce a test sandwich, as described with respect to Example 1, and the test sandwich was subjected to HAST conditions for 96 hours. The material passed HAST. In addition, the thermal performance did not significantly degrade. Specifically, the thermal impedance of the test sandwich was the same after HAST testing compared to before (both values were 0.11° C.·cm²/W).

Example 3

Example 3 was prepared according to the procedure described above with respect to Example 1. The types and amounts of the different components were also the same as in Example 1, except that the amount of Kraton was 6.2 wt % and the amount of antioxidant was 0.50 wt %. In addition, the wax of Example 1 was replaced with 1.8 wt % Lucant® oil. The coupling agent did not appear to be completely miscible with the combination of elastomer, oil and antioxidant. This TIM was prepared and tested as described above with respect to Example 1. The test sandwich passed HAST, and the thermal impedance of the material actually decreased (the thermal impedance was 0.11° C.·cm²/W and after HAST testing and 0.10° C.·cm²/W after HAST testing).

Comparative Example 1

Comparative Example 1 was prepared according to the procedure described above with respect to Example 1. The types and amounts of the different components were the same as in Example 1 except that the following coupling agent was used in place of the coupling agent of Example 1:
Titanium IV, 2-propanolato, tris isooctadecanoato-O Formula X:

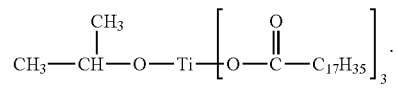

In addition, 0.4 wt % of butylated melamine was also added and 90.4 wt % (rather than 90.8 wt %) of the filler was added. The coupling agent appeared to be substantially completely miscible with the combination of elastomer, wax, antioxidant and butylated melamine. The material failed HAST. In addition, significant degradation in the thermal performance was observed. Specifically, the thermal impedance of the test sandwich increased from 0.10° C.·cm²/W to 0.50° C.·cm²/W).

The above examples illustrate that the coupling agents of the present invention provide a thermal interface material that passes HAST and provides relatively consistent thermal performance before and after HAST testing.

In addition, several of the coupling agents were tested in an abbreviated HAST testing.

Example 4

A TIM was produced according to Example 1 above and the TIM was spread on a nickel-coated copper heat spreader at a thickness of 10 mil and exposed to HAST conditions for 96 hours. The material had a 0.4% gain in weight.

Example 5

A TIM was produced according to Example 2 above, and the TIM was prepared and tested as described above with respect to Example 4. The material had a 0.3% gain in weight.

Example 6

A TIM was produced according to Example 3 above, and the TIM was prepared and tested as described above with respect to Example 4. The material had a 0.7% gain in weight.

Example 7

A TIM was produced according to Example 2 except that Titanium IV, 2-propanolato, tris(dioctyl)-pyrophosphato-O) adduct with 1 mole of diisooctyl phosphite was used in place of the Titanium IV 2,2 (bis 2-propenolatomethyl)butanolato, tris(dioctyl)pyrophosphato-O. The coupling agent did not appear to be completely miscible with the combination of elastomer, wax and antioxidant. This TIM was prepared and tested as described above with respect to Example 4. The material had a 0.2% gain in weight.

Example 8

A TIM was produced according to Example 3 except that a microcrystalline wax with a melting point of about 45° C. (the same wax as in Example 1) was used in place of the Lucant® oil. The coupling agent did not appear to be completely miscible with the combination of elastomer, wax and antioxidant. This TIM was prepared and tested as described above with respect to Example 4. The material had no change in weight.

Comparative Example 2

A TIM was produced according to Comparative Example 1 above. This TIM was prepared and tested as described above with respect to Example 4. The material had a 20.4% gain in weight.

Comparative Example 3

A TIM was produced according to Example 1 except that Titanium IV, 2-propanolato, tris isooctadecanoato-O coupling agent was used in place of the coupling agent of Example 1. The coupling agent appeared to be substantially completely miscible with the combination of elastomer, wax and antioxidant. This TIM was prepared and tested as described above with respect to Example 4. The material had a 20.7% gain in weight.

These abbreviated HAST tests described in Examples 4-8 and comparative examples 2 and 3 show that formulations that pass the full HAST testing and have good stability in thermal performance after being subjected to the full HAST testing also have a relatively small change in weight when tested in the abbreviated HAST test. In addition, these abbreviated HAST tests illustrate that different TIM formulations of the present invention also have a relatively low weight loss and/or degradation in thermal performance after abbreviated HAST testing.

The following examples 9-14 and comparative examples 4 and 5 were subjected to full HAST testing:

Example 9

In example 9, 6.22 wt % Kraton® elastomer (a hydroxyl-terminated ethylene butylene copolymer, specialty mono-ol), 1.78 wt % of a microcrystalline wax with a melting point of about 45° C., and 0.5 wt % Irganox® 1076 were combined and blended in a heated mixer (the mixer had a heating jacket and the heating oil was maintained at 140° C.) until the combination had melted and had a substantially homogeneous appearance. 0.67 wt % Titanium IV 2,2 (bis 2-propenolatomethyl)butanolato, tris(dioctyl)pyrophosphato-O was added, and the combination was blended at an oil temperature of 140° C., again until the combination had a substantially homogeneous appearance. 90.8 wt % of Aluminum powder was added, and the combination was again blended at an oil temperature of 140° C. until it had a substantially homogeneous appearance, forming a heat transfer material. The coupling agent did not appear to be completely miscible with the combination of elastomer, wax and antioxidant.

The heat transfer material was disposed between a silicon die and a nickel coated heat spreader and subjected to full HAST testing. The thermal impedance prior to HAST was 0.098° C. cm$^2$/W. After HAST, thermal impedance was 0.077° C. cm$^2$/W. Thermal conductivity was 3.26 W/mK prior to HAST and 4.131 W/mK after HAST.

Example 10

In Example 10, a heat transfer material was produced according to the method described in Example 9 except Zirconium IV 2,2 (bis 2-propenolatomethyl)butanolato, tris(diisooctyl)pyrophosphato-O coupling agent was used in place of the coupling agent used in Example 9. However, when an attempt was made to spread this heat transfer material between a silicon die and a heat spreader, the viscosity of the heat spreader material was too high to form an effective sandwich, and this material was not tested. Rather, the heat transfer material was produced again according to the method described in Example 9 except the oil temperatures were 120° C. rather than 140° C. The lower temperature resulted in a lower dynamic viscosity of 161 Pa·s compared to 205 Pa·s at the higher temperature (viscosity was measured using cone and plate (1 degree cone) geometry in a Haake RT20 rheometer at 87° C. and reported at 25 Hz.

The heat transfer material that was produced at the lower temperature was disposed between a silicon die and a nickel coated heat spreader and subjected to full HAST testing. The thermal impedance prior to HAST was 0.108° C. cm$^2$/W. After HAST, thermal impedance was 0.106° C. cm$^2$/W. Thermal conductivity was 3.41 W/mK prior to HAST and 3.478 W/mK after HAST.

This example illustrates that some properties of heat transfer materials that contain certain coupling agents may be affected by processing conditions such as temperature. Specifically, in some embodiments the processing conditions of any of the heat transfer materials described herein may be adjusted to ensure that the dynamic viscosity of the heat transfer material is less than 200 Pa·s, less than 180 Pa·s, less than 170 Pa·s or less than 160 Pa·s. For example, the temperature of the heating medium may be maintained below 140° C., at or below 130° C., or at or below 120° C.

Example 11

In Example 11, a heat transfer material was produced according to the method described in Example 9 except Titanium IV bis(diisooctyl)pyrophosphato-O, ethylenediolato, (adduct), bis(dioctyl) (hydrogen)phosphite coupling agent was used in place of the coupling agent used in Example 9.

The heat transfer material was disposed between a silicon die and a nickel coated heat spreader and subjected to full HAST testing. The thermal impedance prior to HAST was 0.107° C. cm²/W. After HAST, thermal impedance was 0.105° C. cm²/W. Thermal conductivity was 3.515 W/mK prior to HAST and 3.588 W/mK after HAST.

Example 12

In Example 12, a heat transfer material was produced according to the method described in Example 9 except Titanium IV, 2-propanolato, tris(dioctyl)-pyrophosphato-O) adduct with 1 mole of diisooctyl phosphite coupling agent was used in place of the coupling agent used in Example 9.

The heat transfer material was disposed between a silicon die and a nickel coated heat spreader and subjected to full HAST testing. The thermal impedance prior to HAST was 0.099° C. cm²/W. After HAST, thermal impedance was 0.073° C. cm²/W. Thermal conductivity was 3.265 W/mK prior to HAST and 4.411 W/mK after HAST.

Example 13

In Example 13, a heat transfer material was produced according to the method described in Example 9 except Titanium IV bis(dioctyl)pyrophosphato-O, oxoethylenediolato, (adduct), bis(dioctyl) (hydrogen)phosphite-O coupling agent was used in place of the coupling agent used in Example 9.

The heat transfer material was disposed between a silicon die and a nickel coated heat spreader and subjected to full HAST testing. The thermal impedance prior to HAST was 0.098° C. cm²/W. After HAST, thermal impedance was 0.088° C. cm²/W. Thermal conductivity was 3.189 W/mK prior to HAST and 3.551 W/mK after HAST.

Example 14

In Example 14, a heat transfer material was produced according to the method described in Example 9 except (Zirconium IV 2,2-bis(2-propenolatomethyl) butanolato, cyclo di[2,2-(bis 2-propenolatomethyl)butanolato], pyrophosphato-O,O) coupling agent was used in place of the coupling agent used in Example 9.

The heat transfer material was disposed between a silicon die and a nickel coated heat spreader and subjected to full HAST testing. The thermal impedance prior to HAST was 0.107° C. cm²/W. After HAST, thermal impedance was 0.098° C. cm²/W. Thermal conductivity was 3.262 W/mK prior to HAST and 3.566 W/mK after HAST.

Comparative Example 4

In Comparative Example 4, a heat transfer material was produced according to the method described in Example 9 except Titanium IV, 2-propanolato, tris isooctadecanoato-O coupling agent was used in place of the coupling agent used in Example 9.

The heat transfer material was disposed between a silicon die and a nickel coated heat spreader and subjected to full HAST testing. The thermal impedance prior to HAST was 0.108° C. cm²/W. After HAST, thermal impedance was 0.204° C. cm²/W. Thermal conductivity was 3.403 W/mK prior to HAST and 1.924 W/mK after HAST.

This Comparative Example was also produced at a lower temperature of 120° C. Samples produced at this lower temperature were disposed between a silicon die and a nickel coated heat spreader and subjected to full HAST testing. The thermal impedance prior to HAST was 0.109° C. cm²/W. After HAST, thermal impedance was 0.365° C. cm²/W. Thermal conductivity was 3.515 W/mK prior to HAST and 1.196 W/mK after HAST. Because the results at both temperatures were similar, the thermal impedance and the thermal conductivity do not appear to be affected by changes in the temperature within this temperature range.

Comparative Example 5

In Comparative Example 5, a heat transfer material was produced according to the method described in Example 9 except that the following coupling agent was used:
Titanium IV, 2,2 (bis 2-propenolatomethyl)butanolato, tris neodecanoato-O:

Formula XI:

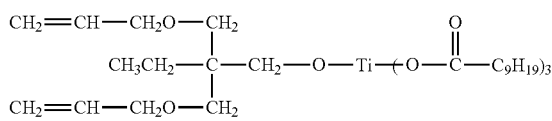

The heat transfer material was disposed between a silicon die and a nickel coated heat spreader and subjected to full HAST testing. The thermal impedance prior to HAST was 0.131° C. cm²/W. After HAST, thermal impedance was 0.263° C. cm²/W. Thermal conductivity was 3.769 W/mK prior to HAST and 1.921 W/mK after HAST.

Examples 9-14 and Comparative Examples 4 and 5 show that heat transfer materials of the present invention exhibit acceptable and stable thermal properties when compared to heat transfer materials produced according to Comparative Examples 4 and 5.

The invention claimed is:

1. A heat transfer material comprising:
    about 3 wt. % to about 14 wt. % of a polymeric elastomer material;
    a wax, wherein the wax comprises less than about 10 wt. % of the heat transfer material;
    about 80 wt. % to about 95 wt. % of a thermally conductive filler; and
    about 0.3 wt. % to about 2 wt. % of a coupling agent selected from the group consisting of: titanium IV 2,2 (bis 2-propenolatomethyl)butanolato, tris(dioctyl)pyrophosphato-O; zirconium IV 2,2 (bis 2-propenolatomethyl)butanolato, tris(diisooctyl)pyrophosphato-O; titanium IV bis(dioctyl)pyrophosphato-O, oxoethylenediolato, adduct, bis(dioctyl) (hydrogen) phosphite-O; and zirconium IV 2,2-bis(2-propenolatomethyl)butanolato, cyclo di[2,2-(bis 2-propenolatomethyl)butanolato], pyrophosphato-O,O.

2. The material of claim 1, wherein the polymeric elastomer material comprises hydrogenated polybutadiene.

3. The material of claim 1, wherein the thermally conductive filler comprises particles of a metal selected from the group consisting of: silver, aluminum, copper and alloys thereof.

4. The material of claim 3, wherein the thermally conductive filler comprises particles of aluminum.

5. The material of claim 1, wherein the coupling agent is titanium IV 2,2 (bis 2-propenolatomethyl)butanolato, tris (dioctyl)pyrophosphato-O.

6. The material of claim 5, wherein the material comprises from about 0.5 wt. % to about 1 wt. % of the coupling agent.

7. The material of claim 5, wherein the material comprises from about 0.5 wt. % to about 0.7 wt. % of the coupling agent.

8. The material of claim 5, wherein the material comprises:
- from about 5 wt. % to about 10 wt. % of the polymeric elastomer material;
- from about 1 wt. % to about 5 wt. % of the wax;
- from about 85 wt. % to about 92 wt. % of the thermally conductive filler; and
- from about 0.5 wt. % to about 1 wt. % of the coupling agent.

9. The material of claim 5, wherein the polymer elastomer material comprises a material selected from the group consisting of: an ethylene-propylene rubber, a polyethylene/butylene, a polyethylene-butylene-styrene, a polyethylene-propylene-styrene, a hydrogenated polyalkyldiene mono-ol, a hydrogenated polyalkyldiene diol, a hydrogenated polyisoprene, polyolefin elastomer, and blends thereof.

10. The material of claim 5, wherein the polymer elastomer material comprises a hydrogenated polybutadiene mono-ol.

11. The material of claim 5, further comprising an amine resin that is crosslinkable with the polymeric elastomer material.

12. The material of claim 1, wherein the coupling agent is zirconium IV 2,2 (bis 2-propenolatomethyl)butanolato, tris (diisooctyl)pyrophosphato-O.

13. The material of claim 1, wherein the coupling agent is titanium IV bis(dioctyl)pyrophosphato-O, oxoethylenediolato, adduct, bis(dioctyl) (hydrogen)phosphite-O.

14. The material of claim 1, wherein the coupling agent is zirconium IV 2,2-bis(2-propenolatomethyl)butanolato, cyclo di[2,2-(bis 2-propenolatomethyl)butanolato], pyrophosphato-O,O.

15. The material of claim 1, further comprising a phenolic antioxidant.

16. The material of claim 1, wherein the wax comprises a polymer wax selected from polyethylene waxes, polypropylene waxes, and copolymers thereof.

17. The material of claim 16, wherein the wax comprises a polyethylene homopolymer.

18. The material of claim 1, further comprising an amine resin that is crosslinkable with the polymeric elastomer material.

19. The material of claim 18, wherein the amine resin and the polymeric elastomer material are crosslinked at 10% of sites available for crosslinking to produce a liquid-like soft gel.

20. The material of claim 18, wherein the amine resin and the polymeric elastomer material are crosslinked at 40-60% of sites available for crosslinking to produce a solid-like soft gel.

21. The material of claim 18, wherein the material comprises:
- from about 5 wt. % to about 10 wt. % of the polymeric elastomer material;
- from about 1 wt. % to about 5 wt. % of the wax;
- from about 85 wt. % to about 92 wt. % of the thermally conductive filler;
- from about 0.5 wt. % to about 1 wt. % of the coupling agent;
- from about 0.07 wt. % to about 1.1 wt. % of a phenolic antioxidant; and
- less than about 1 wt. % of the amine resin.

22. The material of claim 18, wherein the amine resin is an alkylated melamine.

23. The material of claim 1, wherein the polymer elastomer material comprises a material selected from the group consisting of: an ethylene-propylene rubber, a polyethylene/butylene, a polyethylene-butylene-styrene, a polyethylene-propylene-styrene, a hydrogenated polyalkyldiene mono-ol, a hydrogenated polyalkyldiene diol, a hydrogenated polyisoprene, polyolefin elastomer, and blends thereof.

24. The material of claim 1, wherein the polymer elastomer material comprises a hydrogenated polybutadiene mono-ol.

* * * * *